(12) United States Patent
Hu et al.

(10) Patent No.: US 8,575,933 B2
(45) Date of Patent: Nov. 5, 2013

(54) METHOD FOR MOTION CORRECTION IN MAGNETIC RESONANCE IMAGING USING RADIO FREQUENCY COIL ARRAYS

(71) Applicants: Peng Hu, Brookline, MA (US); Reza Nezafat, Newton, MA (US)

(72) Inventors: Peng Hu, Brookline, MA (US); Reza Nezafat, Newton, MA (US)

(73) Assignee: Beth Israel Deaconess Medical Center, Inc., Boston, MA (US)

( * ) Notice: Subject to any disclaimer, the term of this patent is extended or adjusted under 35 U.S.C. 154(b) by 0 days.

(21) Appl. No.: 13/793,918

(22) Filed: Mar. 11, 2013

(65) Prior Publication Data

US 2013/0187652 A1   Jul. 25, 2013

Related U.S. Application Data

(62) Division of application No. 12/688,550, filed on Jan. 15, 2010, now Pat. No. 8,427,153.

(51) Int. Cl.
*G01V 3/00* (2006.01)

(52) U.S. Cl.
USPC .......................................... 324/309

(58) Field of Classification Search
USPC ................................. 324/300–322
See application file for complete search history.

(56) References Cited

U.S. PATENT DOCUMENTS

| | | | |
|---|---|---|---|
| 5,910,728 A | 6/1999 | Sodickson | |
| 7,348,776 B1 | 3/2008 | Aksoy et al. | |
| 7,941,204 B1 | 5/2011 | Wang et al. | |
| 8,427,153 B2* | 4/2013 | Hu et al. | 324/309 |
| 2011/0175609 A1* | 7/2011 | Hu et al. | 324/309 |

OTHER PUBLICATIONS

J. Pipe in "Motion Correction with Propeller MRI: Application to Head Motion and Freebreathing Cardiac Imaging," Magnetic Resonance in Medicine, 1999; 42(5):963-969.

P.G. Batchelor, et al., in "Matrix Description of General Motion Correction Applied to Multishot Images," Magnetic Resonance in Medicine, 2005; 54(5):1273-1280.

P. Lai, et al., in "A Respiratory Self-Gating Technique with 3D-Translation Compensation for Free-Breathing Whole-Heart Coronary MRA," Magnetic Resonance in Medicine, 2009; 62(3):731-738.

M. Bydder, et al., in "SMASH Navigators," Magnetic Resonance in Medicine, 2003; 49(3):493-500.

R. Bammer, et al., in "Augmented Generalized SENSE Reconstruction to Correct for Rigid Body Motion," Magnetic Resonance in Medicine, 2007; 57(1):90-102.

K.P. Pruessmann, et al., in "Advances in Sensitivity Encoding with Arbitrary k-Space Trajectories," Magnetic Resonance in Medicine, 2001; 46(4):638-651.

D. Atkinson, et al., in "Coil-Based Artifact Reduction," Magnetic Resonance in Medicine, 2004; 52(4):825-830.

(Continued)

*Primary Examiner* — Dixomara Vargas
(74) *Attorney, Agent, or Firm* — Quarles & Brady, LLP

(57) ABSTRACT

A method for motion correction using coil arrays, termed "MOCCA," is provided, in which coil-dependent motion-related signal variations are employed to determine information related to motion in two and three directions. With such a method, navigator echoes are not required, nor is the acquisition of additional data required to resolve complex motions in more than one direction. The motion estimation and compensation method provided by MOCCA is also applicable to applications of cardiac, respiratory, and other physiological self-gating techniques.

10 Claims, 6 Drawing Sheets

(56) References Cited

OTHER PUBLICATIONS

T.A. Spraggins in "Wireless Retrospective Gating: Application to Cine Cardiac Imaging," Magnetic Resonance Imaging, 1990; 8(6):675-681.

S. Uribe, et al., in "Whole-Heart Cine MRI Using Real-Time Respiratory Self-Gating," Magnetic Resonance in Medicine, 2007; 57(3):606-613.

P. Lai, et al., in "A Dual-Projection Respiratory Self-Gating Technique for Whole-Heart Coronary MRA," Journal of Magnetic Resonance Imaging, 2008; 28(3):612-620.

A. C. Larson, et al., in "Self-Gated Cardiac Cine MRI", Magnetic Resonance in Medicine, 2004; 51(1): 93-102.

A. C. Larson, et al., in "Preliminary Investigation of Respiratory Self-Gating for Free-Breathing Segmented Cine MRI," Magnetic Resonance in Medicine, 2005; 53(1):159-168.

* cited by examiner

METHOD FOR MOTION CORRECTION IN MAGNETIC RESONANCE IMAGING USING RADIO FREQUENCY COIL ARRAYS

CROSS-REFERENCE TO RELATED APPLICATIONS

This application is a divisional of U.S. patent application Ser. No. 12/688,550 filed on Jan. 15, 2010, and entitled Method for Motion Correction in Magnetic Resonance Imaging Using Radio Frequency Coil Arrays.

STATEMENT REGARDING FEDERALLY SPONSORED RESEARCH

This invention was made with United States government support awarded by the following agency: National Institutes of Health NIH EB008743. The United States government has certain rights in this invention.

BACKGROUND OF THE INVENTION

The field of the invention is systems and methods for magnetic resonance imaging ("MRI"). More particularly, the invention relates to systems and methods for motion correction in MRI.

When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped," into the x-y plane to produce a net transverse magnetic moment $M_{xy}$. A signal is emitted by the excited nuclei or "spins," after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically-proven pulse sequences and they also enable the development of new pulse sequences.

The MR signals acquired with an MRI system are signal samples of the subject of the examination in Fourier space, or what is often referred to in the art as "k-space." Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp," a "Fourier," a "rectilinear," or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

There are many other k-space sampling patterns used by MRI systems. These include "radial," or "projection reconstruction" scans in which k-space is sampled as a set of radial sampling trajectories extending from the center of k-space. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then performing a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

Depending on the technique used, many MR scans currently used to produce medical images require many minutes to acquire the necessary data. The reduction of this scan time is an important consideration, since reduced scan time increases patient throughout, improves patient comfort, and improves image quality by reducing motion artifacts. Many different strategies have been developed to shorten the scan time.

One such strategy is referred to generally as "parallel imaging." Parallel imaging techniques use spatial information from arrays of radio frequency ("RF") receiver coils to substitute for the encoding that would otherwise have to be obtained in a sequential fashion using RF pulses and field gradient, such as, for example, phase and frequency encoding. Each of the spatially independent receiver coils of the array carries certain spatial information and has a different sensitivity profile. This information is utilized in order to achieve a complete location encoding of the received MR signals by a combination of the simultaneously acquired data received from the separate coils. Specifically, parallel imaging techniques undersample k-space by reducing the number of acquired phase-encoded k-space sampling lines while keeping the maximal extent covered in k-space fixed. The combination of the separate MR signals produced by the separate receiver coils enables a reduction of the acquisition time required for an image, in comparison to conventional k-space data acquisition, by a factor that, in the most favorable case, equals the number of the receiver coils. Thus the use of multiple receiver coils acts to multiply imaging speed, without increasing gradient switching rates or RF power.

Because it requires time to acquire a complete k-space MR data set, subject motion presents a problem in many clinical applications. Motion due to respiration, cardiac motion, or peristalsis can produce image artifacts such as blurring or ghosting. There are many strategies used to suppress such artifacts. These include cardiac or respiratory gating techniques that acquire MR data only during certain phases of the cardiac or respiratory cycle. The subject is thus scanned while in a particular position, but the overall scan time is increased substantially because MR data is not acquired over substantial portions of each motion cycle.

Another technique for dealing with subject motion is to interleave so-called "navigator" pulse sequences into the scan to measure subject motion. Navigator pulse sequences may be used during a scan to periodically acquire subject motion information with which the acquired k-space MR image data may be retrospectively corrected. Such navigator data may also be used to alter scanner operation to prospectively correct for subject motion. In either case, the interleaved navigator pulse sequences can add considerable scan time and in some cases they can disrupt the magnetization equilibrium required by imaging pulse sequences.

Two types of subject motion commonly exist when imaging a subject with MRI. These include rigid motion, including bulk translation and rotation; and non-rigid motion, including cardiac and respiratory motion. Numerous motion compensation methods have been proposed to address these sources of subject motion, including navigator echo methods; radial self-navigation methods; PROPELLER methods, such as those described by J. Pipe in "Motion Correction with PROPELLER MRI: Application to Head Motion and Freebreathing Cardiac Imaging," *Magnetic Resonance in Medicine*, 1999; 42(5):963-969; general matrix inversion methods, such as those described by P. G. Batchelor, et al., in "Matrix Description of General Motion Correction Applied to Multishot Images," *Magnetic Resonance in Medicine*, 2005; 54(5): 1273-1280; and projection-based self-gating methods, such as those described by P. Lai, et al., in "A Respiratory Self-Gating Technique with 3D-Translation Compensation for Free-Breathing Whole-Heart Coronary MRA," *Magnetic Resonance in Medicine*, 2009; 62(3):731-738.

The use of multi-coil arrays to accelerate image acquisition using parallel imaging presents the opportunity to use the redundant information provided by coil arrays for motion estimation and correction. For example, it has been shown that a generalized SMASH technique can be employed to predict a k-space line using previously acquired adjacent lines, as described by M. Bydder, et al., in "SMASH Navigators," *Magnetic Resonance in Medicine*, 2003; 49(3):493-500. In this method, the predicted k-space line is compared with the actual acquired k-space line and the difference is used to correct for two-dimensional translations. However, this method does not correct for common imaging scenario where the body and coil array have relative motion, such as, in brain imaging applications using a rigid brain coil or in cardiac imaging applications with static posterior coil elements.

In another method, such as the one described by R. Bammer, et al., in "Augmented Generalized SENSE Reconstruction to Correct for Rigid Body Motion," *Magnetic Resonance in Medicine*, 2007; 57(1):90-102, the bulk motion parameters (translation and rotation) were integrated into an iterative SENSE method, such as the one described by K. P. Pruessmann, et al., in "Advances in Sensitivity Encoding with Arbitrary k-Space Trajectories," *Magnetic Resonance in Medicine*, 2001; 46(4):638-651, in order to correct for motion effects. In this method, the motion parameters are estimated from separately acquired, low-resolution navigator images using a similarity measure. For the most commonly used Cartesian sampling, the time required to acquire the navigator images is likely prohibitively long because they need to be acquired for every imaging shot.

In yet another method, such as the one described by D. Atkinson, et al., in "Coil-Based Artifact Reduction," *Magnetic Resonance in Medicine*, 2004; 52(4):825-830, a separate uniform image for each coil is estimated using a generalized SMASH method that integrates motion parameters into the reconstruction and compares them with ones estimated from all the coils. In this method, the motion parameters that minimize the differences are chosen as the estimated motion.

For cardiac and respiratory motion, accurately resolving the amount of motion is more difficult because these types of motion are typically non-rigid. Currently, the method most widely recognized as being successful for cardiac motion compensation is electrocardiogram ("ECG") gating. In addition, navigator-based methods have been successful for respiratory motion compensation in cardiac imaging applications. Recently, various cardiac and respiratory self-gating methods have been developed to remove the need for ECG signals, breath-holding, or navigator echoes. In one such method, such as the one described by T. A. Spraggins in "Wireless Retrospective Gating: Application to Cine Cardiac Imaging," *Magnetic Resonance Imaging*, 1990; 8(6):675-681, a surrogate ECG signal is derived by monitoring the k-space center peak signal. This concept was extended in a radial imaging cardiac self-gating method, such as the one described by A. C. Larson, et al., in "Self-Gated Cardiac Cine MRI," *Magnetic Resonance in Medicine*, 2004; 51(1): 93-102, in which k-space peak magnitude, center of mass ("COM"), and a series of low-resolution navigator images are utilized to estimate motion. Similar methods with radial sampling have also been applied to respiratory self-gating, such as the one described by P. Lai, et al., in "A Dual-Projection Respiratory Self-Gating Technique for Whole-Heart Coronary MRA," *Journal of Magnetic Resonance Imaging*, 2008; 28(3):612-620. Such self-gating methods use the signal from a single coil or combine multiple coil signals into a single composite signal.

With multiple receiver coil arrays commonly used in parallel imaging, each coil has localized sensitivity profiles. Thus, motion of the object relative to the coils causes variations in the received signal. The amount and polarity of these variations are different among the coils depending on the geometric configuration of each coil.

It would therefore be advantageous to provide a method for motion estimation and compensation that does not require the acquisition of time-intensive navigators and in which three-dimensional motion can be resolved without the acquisition of significant additional image data.

SUMMARY OF THE INVENTION

The present invention overcomes the aforementioned drawbacks by providing a method for motion correction using coil arrays termed "MOCCA," in which navigators are not required and in which coil-dependent motion-related signal variations are employed to determine information related to motion in two and three directions, such that additional image data need not be acquired to compensate for complex motions in more than one direction. The motion estimation and compensation method provided by MOCCA is also applicable to applications of cardiac, respiratory, and other physiological self-gating techniques.

It is an aspect of the invention to provide a method for producing an image of a subject in which image artifacts associated with subject motion are substantially suppressed. A coil sensitivity map is estimated for each radio frequency ("RF") receiver coil in a coil array and a k-space data set is acquired from each RF receiver coil in the coil array using a magnetic resonance imaging ("MRI") system. Subject motion that occurred during the data acquisition is then estimated. In particular, the subject motion that occurred relative to each RF receiver coil is estimated using the corresponding estimated coil sensitivity maps and acquired k-space data. For example, signal variations in the acquired k-space data that corresponds to the motion of the subject relative to the receiver coils in the coil array is compare to estimated signal variations corresponding to estimated motion parameters. The acquired k-space data is then corrected for the subject motion using the estimated subject motion and images in which artifacts associated with the subject motion are substantially suppressed are reconstructed from the corrected k-space data.

It is another aspect of the invention to provide a method for self-gating an image acquisition with an MRI system. For example, a respiratory or cardiac gating signal is produced and utilized to reconstruct images of a subject in which respiratory or cardiac motion is substantially suppressed. A k-space data set is acquired from each RF receiver coil in a coil array with the MRI system. In general, each acquired k-space data set includes signal variations indicative of motion of a portion of a subject that occurs relative to the respective receiver coil. As noted above, exemplary portions of the subject include the heart, lungs, and diaphragm, thereby relating the signal variations to cardiac and respiratory motion. A portion of the acquired k-space data is selected as reference data, to which other acquired k-space data is compared. As a result of the signal variations produced by the motion of the portion of the subject relative to the RF receiver coils, a gating signal indicative of the motion of the portion of the subject is produced from the performed comparison. For example, correlation coefficients are calculated between the reference data and other k-space data, such that the correlation coefficients define a gating signal. The produced gating signal is then utilized to reconstruct an image of the subject from the acquired k-space data sets in which motion of the portion of the subject is substantially suppressed.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
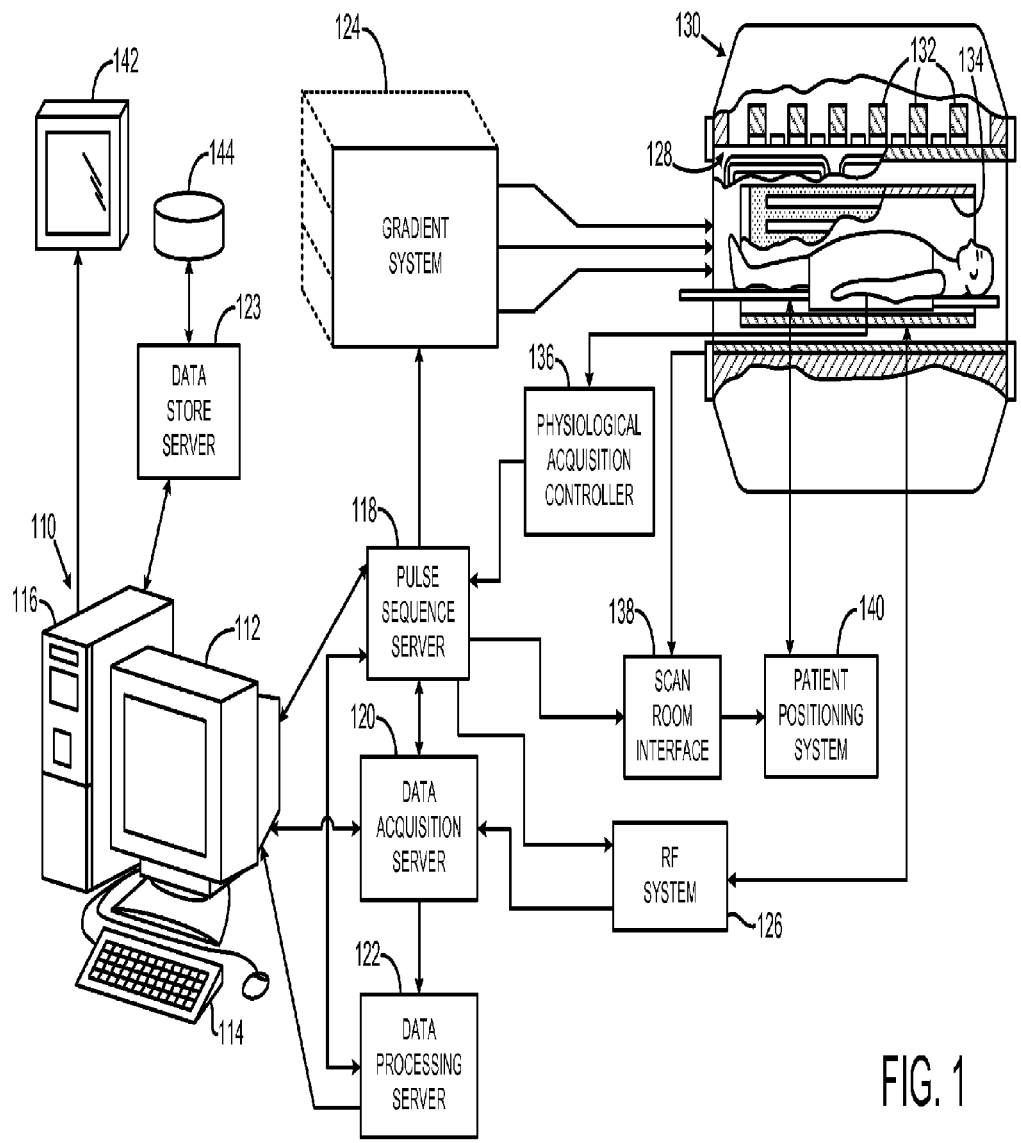
FIG. 1 is a block diagram of an MRI system that employs the present invention.

Referring particularly to FIG. 1, the preferred embodiment of the invention is employed in a magnetic resonance imaging ("MRI") system. The MRI system includes a workstation 110 having a display 112 and a keyboard 114. The workstation 110 includes a processor 116 that is a commercially available programmable machine running a commercially available operating system. The workstation 110 provides the operator interface that enables scan prescriptions to be entered into the MRI system. The workstation 110 is coupled to four servers: a pulse sequence server 118; a data acquisition server 120; a data processing server 122, and a data store server 123. The workstation 110 and each server 118, 120, 122 and 123 are connected to communicate with each other.

The pulse sequence server 118 functions in response to instructions downloaded from the workstation 110 to operate a gradient system 124 and a radiofrequency ("RF") system 126. Gradient waveforms necessary to perform the prescribed scan are produced and applied to the gradient system 124 that excites gradient coils in an assembly 128 to produce the magnetic field gradients $G_x$, $G_y$, and $G_z$ used for position encoding MR signals. The gradient coil assembly 128 forms part of a magnet assembly 130 that includes a polarizing magnet 132 and a whole-body RF coil 134.

RF excitation waveforms are applied to the RF coil 134 by the RF system 126 to perform the prescribed magnetic resonance pulse sequence. Responsive MR signals detected by the RF coil 134 or a separate local coil (not shown in FIG. 1) are received by the RF system 126, amplified, demodulated, filtered and digitized under direction of commands produced by the pulse sequence server 118. The RF system 126 includes an RF transmitter for producing a wide variety of RF pulses used in MR pulse sequences. The RF transmitter is responsive to the scan prescription and direction from the pulse sequence server 118 to produce RF pulses of the desired frequency, phase and pulse amplitude waveform. The generated RF pulses may be applied to the whole body RF coil 134 or to one or more local coils or coil arrays (not shown in FIG. 1).

The RF system 126 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2},$$

and the phase of the received MR signal may also be determined:

$$\phi = \tan^{-1}\left(\frac{Q}{I}\right).$$

The pulse sequence server 118 also optionally receives patient data from a physiological acquisition controller 136. The controller 136 receives signals from a number of different sensors connected to the patient, such as ECG signals from electrodes or respiratory signals from a bellows. Such signals are typically used by the pulse sequence server 118 to synchronize, or "gate", the performance of the scan with the subject's respiration or heart beat.

The pulse sequence server 118 also connects to a scan room interface circuit 138 that receives signals from various sensors associated with the condition of the patient and the magnet system. It is also through the scan room interface circuit 138 that a patient positioning system 140 receives commands to move the patient to desired positions during the scan.

The digitized MR signal samples produced by the RF system 126 are received by the data acquisition server 120. The data acquisition server 120 operates in response to instructions downloaded from the workstation 110 to receive the real-time MR data and provide buffer storage such that no data is lost by data overrun. In some scans the data acquisition server 120 does little more than pass the acquired MR data to the data processor server 122. However, in scans that require information derived from acquired MR data to control the further performance of the scan, the data acquisition server 120 is programmed to produce such information and convey it to the pulse sequence server 118. For example, during prescans MR data is acquired and used to calibrate the pulse sequence performed by the pulse sequence server 118. Also, navigator signals may be acquired during a scan and used to adjust RF or gradient system operating parameters or to control the view order in which k-space is sampled. And, the data acquisition server 120 may be employed to process MR signals used to detect the arrival of contrast agent in a magnetic resonance angiography (MRA) scan. In all these examples the data acquisition server 120 acquires MR data and processes it in real-time to produce information that is used to control the scan.

The data processing server 122 receives MR data from the data acquisition server 120 and processes it in accordance with instructions downloaded from the workstation 110. Such processing may include, for example: Fourier transformation of raw k-space MR data to produce two or three-dimensional images; the application of filters to a reconstructed image; the performance of a backprojection image reconstruction of acquired MR data; the calculation of functional MR images; the calculation of motion or flow images, etc.

Images reconstructed by the data processing server 122 are conveyed back to the workstation 110 where they are stored. Real-time images are stored in a data base memory cache (not shown) from which they may be output to operator display 112 or a display 142 that is located near the magnet assembly 130 for use by attending physicians. Batch mode images or selected real time images are stored in a host database on disc storage 144. When such images have been reconstructed and transferred to storage, the data processing server 122 notifies the data store server 123 on the workstation 110. The workstation 110 may be used by an operator to archive the images, produce films, or send the images via a network to other facilities.

Robust motion correction is challenging in many MRI applications. As described herein, a method for motion correction using coil arrays termed "MOCCA" is provided. In general, the elements of a coil array are used as individual motion "sensors" that detect motion-induced signal variations that are modulated by coil sensitivity maps. MOCCA is capable of accurately resolving arbitrary two-dimensional bulk motion in clinical imaging scenarios, such as brain imaging, using a single one-dimensional k-space center line, as will be described below in detail. The inclusion of multiple coils by stacking multi-coil data into a column vector increases the accuracy of motion detection compared to existing methods based on projections. Furthermore, MOCCA enables breath-held cardiac self-gated cine MRI without the need for the acquisition of an ECG signal, and free-breathing respiratory self-gated cine MRI without breath-holding. MOCCA also enables cardiac and respiratory self-gating for other cardiac MRI applications, such as imaging of the coronary arteries and myocardial infarction. Though many of the examples presented herein are for brain and cardiac imaging, MOCCA is readily adaptable to other anatomic regions in which motion correction is important. Furthermore, the concept of MOCCA may be readily integrated into existing motion correction methods.

Depending on the geometric configuration of the coils, the detected signal change due to motion can be quite different due to the localized coil sensitivity maps for each respective coil element. MOCCA uses this effect to derive the amount of motion by calculating, for example, a correlation coefficient between the composite k-space signal stacked from all the coils and a reference composite signal. The same concept is applicable to self-gated cardiac imaging in order to derive cardiac and respiratory self-gating signals, as will be described below in detail.

MOCCA is more accurate for motion estimation than existing projection-based methods, in which the center of mass or correlation coefficient of projections from a single coil is used. The localized coil sensitivity of each coil limits the application of these methods, whereas they help MOCCA improve its sensitivity of motion detection. Even when combining the projections from multiple coils using root sum-of-squares ("SOS") methods, the potential spatially varying SOS projection still may result in potential error in motion estimation.

Figure 2:
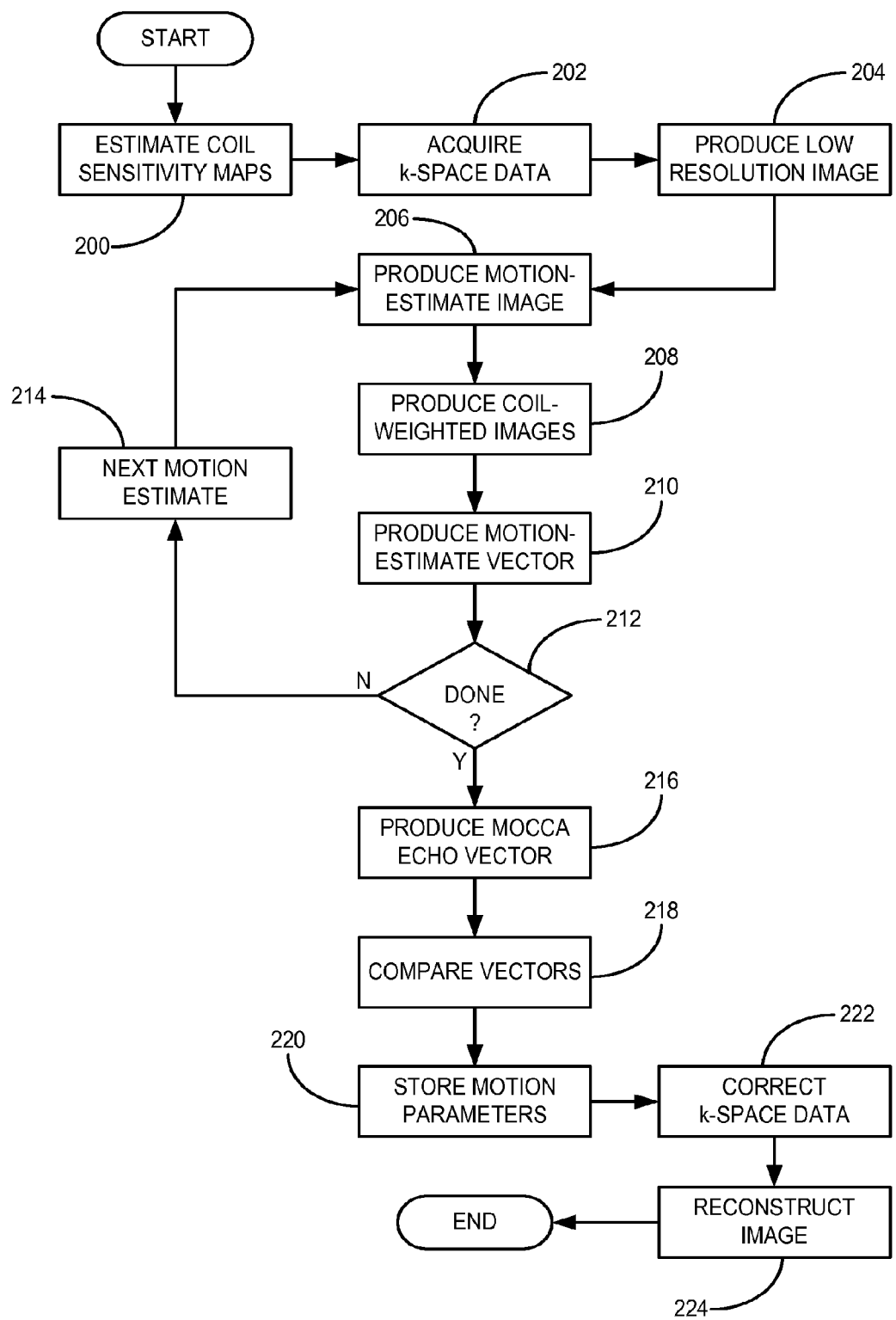
FIG. 2 is a flowchart setting forth the steps of an exemplary method for motion correction using coil arrays ("MOCCA") in accordance with the present invention.

Referring now to FIG. 2, a flowchart setting forth the steps of an exemplary method for motion correction using coil arrays ("MOCCA") is illustrated. As a result of the particular geometric configuration of the receiver coils in a multiple coil array, subject motion will result in signal changes that are distinct to each coil due to their localized spatial sensitivity profiles. In some instances, the acquired signals can be opposite polarity. MOCCA uses this effect to derive the amount of motion that occurred during acquisition, as will be described below in detail. In general, however, signal variations produced by the motion of the subject relative to the receiver coil elements are compared with estimated signal variations that correspond to a plurality of estimated motion parameters. In performing such a comparison, information regarding the motion of the subject is determined.

The method begins with the estimation of a coil sensitivity map, $c_\gamma$, for each receiver coil in the coil array, as indicated at step 200. For example, an imaging phantom is employed to produce coil sensitivity maps. In the alternative, the coil sensitivity maps can be estimated in vivo at the beginning of an imaging session, thereby removing the need for an additional phantom scan. In such a scenario, the coil sensitivity maps can undergo further post-processing, such as smoothing, to improve their efficacy.

Following the estimation of the coil sensitivity maps, image data is acquired from the subject, as indicated at step 202. By way of example, image data may be acquired by directing the MRI system using a so-called steady-state free precession ("SSFP") pulse sequence. However, other pulse sequences are contemplated for use with MOCCA, as well. In general, image data is acquired by sampling k-space using either a Cartesian, or non-Cartesian sampling pattern. Each k-space data set contains a plurality of so-called "lines" of k-space data. Depending on the sampling pattern employed, these lines can be straight lines extending along, for example, the $k_x$-axis, $k_y$-axis, $k_z$-axis, or combinations thereof, such as radial lines extending from the center of k-space out to the periphery. Moreover, the k-space lines can also be curved lines, such as spirals. As image data is being acquired, the center line in k-space is acquired repeatedly. This acquisition occurs, for example, before or during each imaging segment. In general, the signal, $S_\gamma$, acquired with the $\gamma^{th}$ receiver coil in a multiple coil array has the form:

$$S_\gamma(k) = \sum_r v(r) c_\gamma(r) W; \quad \text{Eqn. (1)}$$

where $v(r)$ is an image; $c_\gamma(r)$ is a coil sensitivity map for the $\gamma^{th}$ receiver coil in the multiple receiver coil array; $r$ is a spatial location; $k$ is a spatial frequency, or k-space, location; and $W$ is a Fourier encoding kernel having the form:

$$W = e^{-i2\pi r k} \quad \text{Eqn. (2).}$$

In steady-state sequences, such as SSFP, the signal from the imaged subject fluctuates before entering a steady-state. This signal fluctuation can cause non-motion related signal variations in the acquired data; therefore, a number of dummy pulses are played out before each imaging shot in order to mitigate these fluctuations. The impact of this signal fluctuation should be considered when using other types of pulse sequences to acquire image data.

A low resolution reference image is produced next, as indicated at step 204. First, a low resolution image is reconstructed for each coil in the coil array using the k-space data set acquired from the corresponding coil. It will be readily appreciated by those skilled in the art that only a substantially central portion of each acquired k-space data set is employed when reconstructing a low resolution image. The reference image is subsequently produced by combining the plurality of low resolution images using, for example, a root sum-of-squares combination. As a result of the reference image being produced from substantially only the central portion of k-space, the image is substantially free of image artifacts that result from subject motion. Using this produced reference image, a motion-estimate image is produced next, as indicated at step 206. The motion-estimate image is produced by first selecting an estimate of the subject motion that occurred during data acquisition. This estimate of the subject motion includes, for example, a set of estimated motion parameters, such as shifts and rotations, that account for subject motion in an expected range of motion. The motion-estimate image is produced, therefore, by applying these estimated motion parameters to the reference image.

After the motion-estimate image is produced, a plurality of coil-weighted images are produced, as indicated at step 208. The coil-weighted images are produced by weighting the motion-estimate image by the respective coil sensitivity maps estimated earlier. These coil-weighted images are then used to produce a motion-estimate vector, as indicated at step 210. This vector is produced by first transforming the coil-weighted images back into k-space and then, for example stacking the magnitude of the center k-space lines from each corresponding k-space data set into a column vector, such as:

$$\hat{S} = [|\hat{S}_1| \, |\hat{S}_2| \ldots |\hat{S}_\gamma|]^T \quad \text{Eqn. (3);}$$

where $|\hat{S}_\gamma|$ is the magnitude of the center k-space line from the k-space data set produced by transforming the coil-weighted image for the $\gamma^{th}$ receiver coil in the coil array, and $\hat{S}$ is the motion-estimate vector. A determination is then made as to whether all of the desired estimates of subject motion have been utilized to produce a corresponding motion-estimate image, as indicated at decision block 212. If all of the estimated motion parameters have not been employed, then the next set of estimated motion parameters is selected, as indicated at step 214, to produce a next motion-estimate image and steps 206-210 are repeated to produce a motion-estimate vector, $\hat{S}$, corresponding to the next set of estimated motion parameters. In this manner, a plurality of motion-estimate vectors, $\hat{S}_n$, are produced.

When all of the desired motion-estimate vectors have been produced a so-called "MOCCA echo" vector is produced, as indicated at step 216. The MOCCA echo vector is produced from the originally acquired k-space data sets. For example, the magnitude of the center line of each k-space data set is stacked into a column vector, such as:

$$\overline{S} = [|\overline{S}_1| \, |\overline{S}_2| \ldots |\overline{S}_\gamma|]^T \quad \text{Eqn. (4);}$$

where $|\overline{S}_\gamma|$ is the magnitude of the center k-space line from the k-space data set acquired by the $\gamma^{th}$ receiver coil in the coil array, and $\overline{S}$ is the MOCCA echo vector.

It is noted that the phase of the MOCCA echo data is not used, as evidenced in Eqn. (4). The absence of phase information data in the algorithm highlights the mechanism of motion detection using MOCCA. For example, in the scenario where the coil and the object move the same amount, the motion only causes a linear phase shift in k-space and does not change the magnitude. However, for those scenarios addressed by the present method, the relative motion between the coil map and the object changes the coil sensitivity modulation of the object and, therefore, causes a coil-dependent change in k-space signal magnitude. This signal change is used in MOCCA to resolve motion.

To determine whether the estimated motion parameters accurately account for subject motion that occurred during data acquisition, each motion-estimate vector is compared with the MOCCA echo vector, as indicated at step 218. For example, a correlation coefficient between each motion-estimate vector and the MOCCA echo vector is calculated. Preferably, the motion-estimate vector that maximizes this correlation coefficient is subsequently selected as corresponding to the appropriate motion parameters. That is:

$$\Delta r = \arg\max \text{corr}[\hat{S}_n, \overline{S}] \quad \text{Eqn. (5);}$$

where $\Delta r$ is the motion parameter applied in step 206 that resulted in the motion-estimate vector with the maximum correlation with the MOCCA echo vector. However, it is recognized that, in some cases, a motion-estimate vector that fails to maximize the correlation coefficient may be suitable. The motion parameters determined through Eqn. (5) are subsequently stored, as indicated at step 220. These stored motion parameters are then employed to apply a phase correction to the originally acquired k-space data sets, as indicated at step 222. It will be appreciated that this phase correction results in the appropriate correction for the subject motion that occurred during the acquisition of the image data.

Thus, from the corrected k-space data an image is reconstructed, as indicated at step 224. Many different reconstruction methods can be employed at this point, including those commonly known to be useful for so-called parallel image reconstruction.

Not only is the foregoing method helpful for the correction of subject motion, it is also applicable to methods for cardiac and respiratory gating. In fact, estimating non-rigid cardiac and respiratory motion in cardiac imaging remains more difficult than producing similar estimates of bulk motion. To address this difficulty, MOCCA is applied to perform cardiac and respiratory self-gating, in which a cardiac or respiratory gating signal, respectively, is derived from the MOCCA echoes. Since MOCCA is used to derive only a self-gating signal rather than to produce an estimate of the underlying motion, coil sensitivity maps are not acquired for these self-gating applications.

Employing MOCCA for cardiac self-gating has benefits compared to existing cardiac self-gating methods. For example, compared with exemplary cardiac gating methods that monitor k-space peak signal, MOCCA utilizes more k-space data points and multiple coils, which facilitates robust derivation of cardiac self-gating signals. The use of a correlation coefficient in MOCCA also acts to reduce the impact of signal level fluctuations since correlation coefficients are normalized to individual signal levels. Moreover, MOCCA does not require the definition of specific region-of-interest on the heart, which can facilitate the automation of self-gated imaging and reconstruction. Another difference between MOCCA and existing cardiac self-gating methods is that the MOCCA echo signals are acquired only once per imaging segment, whereas in existing methods the signal used to derive the self-gating signal is acquired once for every k-space line. This new approach results in a reduced burden on scan time.

Figure 3:
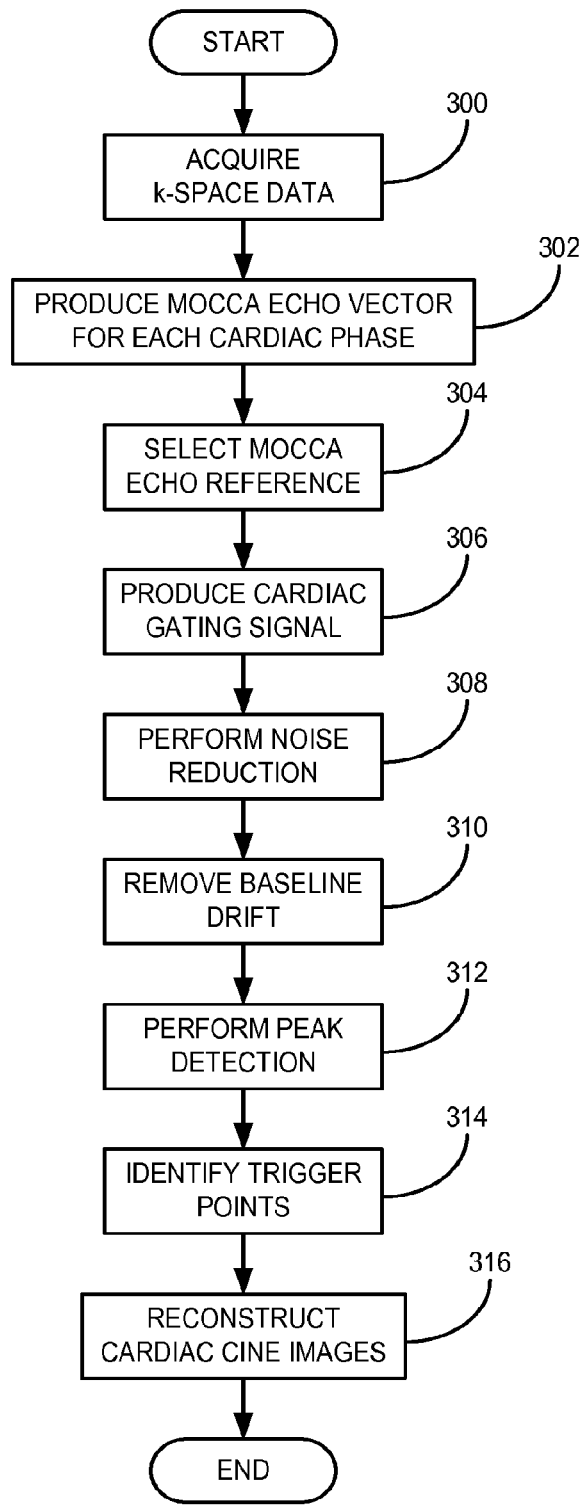
FIG. 3 is a flowchart setting forth the steps of an exemplary method for performing cardiac self-gating using a MOCCA method.

Referring now to FIG. 3, a flowchart setting forth the steps of an exemplary method for cardiac self-gating using MOCCA is illustrated. First, image data is acquired, as indicated at step 300. For example, cardiac cine image data is acquired using a breath-held, retrospectively ECG-gated SSFP pulse sequence. The acquired image data includes image data for a plurality of cardiac phases over at least one cardiac cycle. Moreover, the portion of acquired image data corresponding to each cardiac phase, referred to as a "cardiac phase image data set," also includes a plurality of MOCCA echoes. Next, a MOCCA echo vector is produced for each cardiac phase from the corresponding cardiac phase image data set, as indicated at step 302. As described above, each MOCCA echo vector is produced from the corresponding acquired k-space data. For example, the magnitude of the center line of each k-space data set is stacked into a column vector in accordance with Eqn. (4).

After producing a MOCCA echo vector for each cardiac phase, the method proceeds by selecting one of the produced MOCCA echo vectors as a MOCCA echo reference, as indicated at step 304. For example, the MOCCA echo vector corresponding to the last cardiac phase data set acquired is selected as the MOCCA echo reference. In the alternative, however, any one of the MOCCA echo vectors can be selected as the MOCCA echo reference. Using the MOCCA echo vectors and the MOCCA echo reference, a cardiac gating signal is produced, as indicated at step 306. The gating signal is produced by calculating the correlation coefficient between each of the individual MOCCA echo vectors and the MOCCA echo reference. As will now be described, the produced gating signal is subjected to further processing before being utilized.

First, noise reduction may be performed on the produced signal, as indicated at step 308, using, for example, a 3-point moving average method. Next, as indicated at step 310, baseline drifts may be removed from the gating signal. For example, a 30-point moving average can be performed on the original self-gating signals (prior to noise reduction), and this 30-point moving average can be subtracted from the noise reduced gating signal produced in step 308. The time since the last ECG R-wave is extracted from the scanner for each cardiac imaging shot and used as a temporal reference. A peak detection algorithm, such as one similar to the one described, for example, by A. C. Larson, et al., in "Self-Gated Cardiac Cine MRI", *Magnetic Resonance in Medicine*, 2004; 51(1): 93-102, is used, as indicated at step 312, to detect the negative peak of the self-gating signal; however, no low-pass filtering is employed. Subsequently, trigger points are calculated using the produced gating signal, as indicated at step 314. The trigger points are calculated, for example, by first calculating the first derivative of the gating signal. Using such an approach, the points in the gating signal with both negative slope on the left side and positive slope on the right side are identified as the trigger points. Cardiac cine images are then reconstructed using the MOCCA self-gating triggering, as indicated at step 316.

Figure 4A:
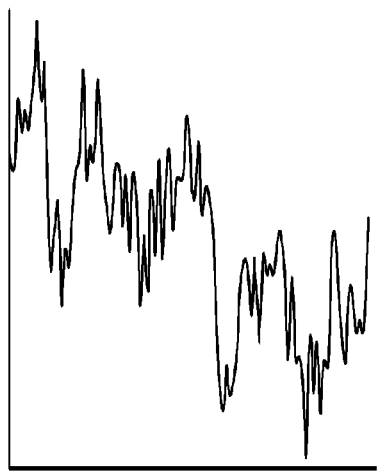
FIG. 4A is a graphic representation of a cardiac gating signal produced with an exemplary k-space center peak method.
Figure 4C:
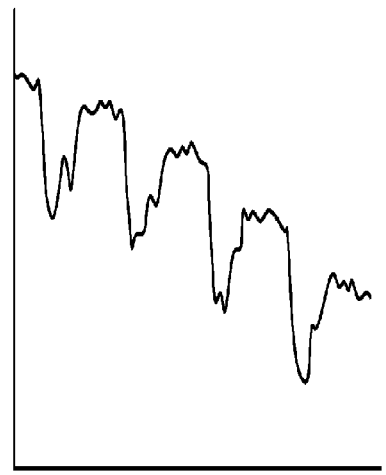
FIG. 4C is a graphic representation of a cardiac gating signal produced with an exemplary MOCCA method, such as the one illustrated in FIG. 3.
Figure 4B:
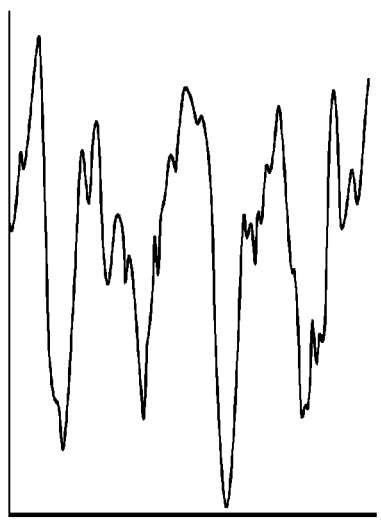
FIG. 4B is a graphic representation of the cardiac gating signal of FIG. 4A after having a baseline drift removed.

A comparison between cardiac gating signals produced by the aforementioned method versus a method in which a self-gating signal is produced from the k-space center peak signal is illustrated in FIGS. 4A-4D. FIG. 4A is a graphic representation of a cardiac gating signal produced from an exemplary k-space center peak method, and FIG. 4B is a graphic representation of that signal after baseline drifting has been removed. Exemplary k-space center peak methods include those in which a series of consecutively acquired central k-space lines are sampled. The peak value of each central k-space line is then selected as the corresponding data point in the produced cardiac gating signal. Such a method is prone to errors from signal fluctuations due to magnetization recovery after, for example, the application of saturation or inversion RF pulses.

Figure 4D:
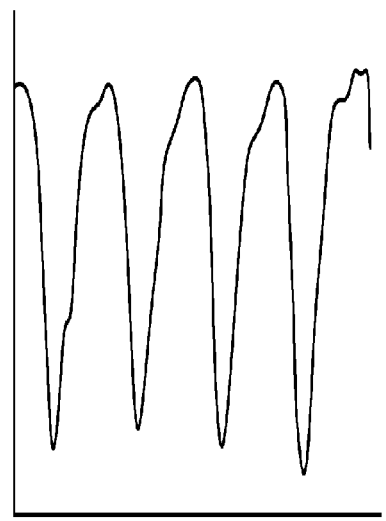
FIG. 4D is a graphic representation of the cardiac gating signal of FIG. 4C after having a baseline drift removed.

In comparison, FIG. 4C is a graphic representation of a cardiac gating signal produced using the aforementioned MOCCA-based method, and FIG. 4D is a graphic representation of that signal after baseline drifting has been removed, in accordance with step 310 above. As a result of MOCCA's use of data acquired over a plurality of receiver coil elements, the self-gating signal derived from the MOCCA echoes is less noisy and includes less fluctuation than self-gating signals produced with other methods, such as the k-space center peak method. This distinction is illustrated in the exemplary cardiac gating signals shown in FIGS. 4A-4D.

Figure 5:
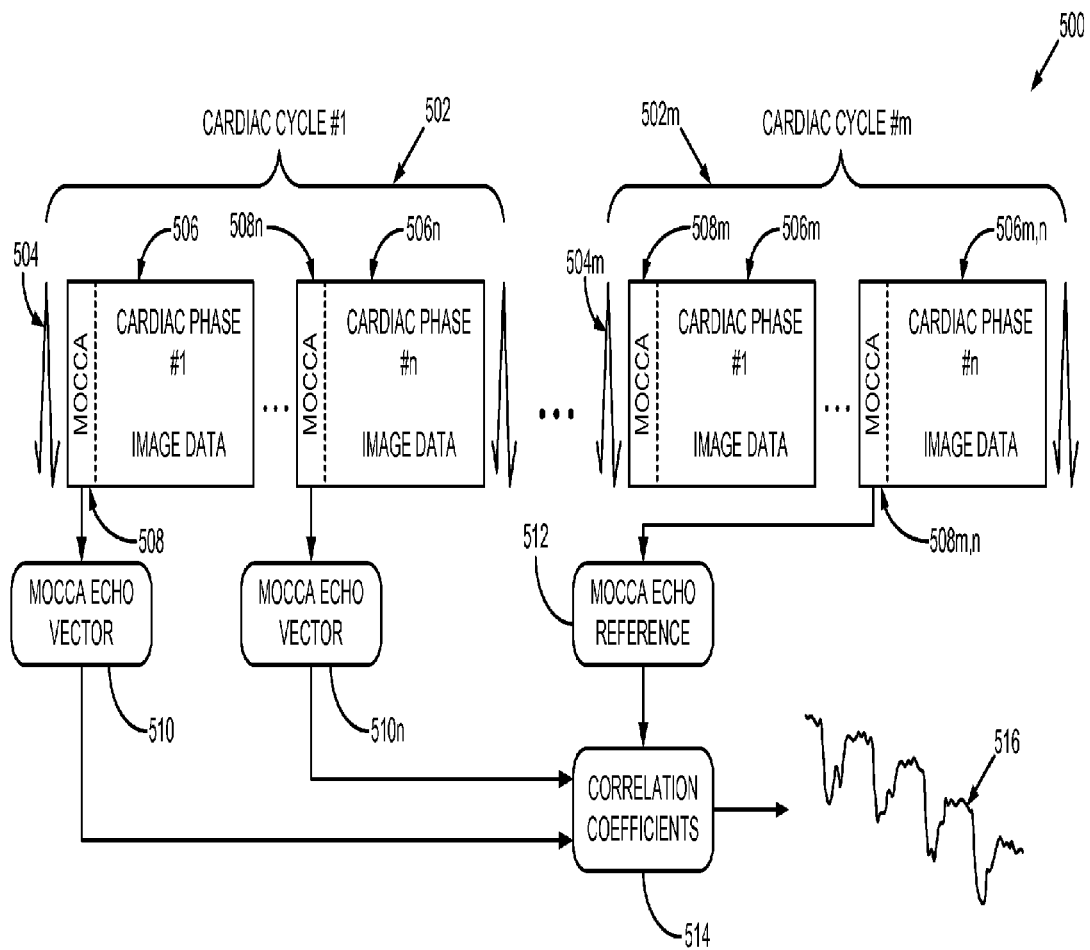
FIG. 5 is an illustration of an exemplary data flow corresponding to the exemplary MOCCA method of cardiac self-gating illustrated in FIG. 3.

With reference now to FIG. 5, an exemplary data flow 500 for a cardiac self-gating acquisition using MOCCA is illustrated. Specifically, FIG. 5 illustrates a data flow 500 for a plurality of cardiac cycles from a first cardiac cycle 502 to an $m^{th}$ cardiac cycle 502*m*. In each cardiac cycle (502, 502*m*), an R-wave peak (504, 504*m*) is identified in a recorded ECG signal, whereby image data is acquired. The image data acquired for each cardiac cycle (502, 502*m*) includes a plurality of cardiac phase image data sets (506, 506*n*; and 506*m*, 506*m,n*). Moreover, each cardiac phase image data set 506 includes a set of MOCCA echoes 508. In general, the MOCCA echoes 508 are acquired at the beginning of each cardiac phase image data set 506. From the MOCCA echoes 508 in each cardiac phase image data set 506, a respective number of associated MOCCA echo vectors (510, 510$n$; and 510$m$, 510$m,n$) are produced. One of these MOCCA echo vectors 510 is subsequently selected to provide a reference echo vector 512 and the correlation coefficient 514 between this reference vector and every other MOCCA echo vector is calculated. The result of this calculation is the production of the cardiac self-gating signal 516, which can optionally be further processed, as described above, before its utilization.

In addition to cardiac self-gating, MOCCA is also applicable to respiratory self-gating methods. As will be described below in detail, such MOCCA-based respiratory self-gating methods offer significant advantages over previous methods of respiratory self-gating.

Typically, recent respiratory self-gating methods for cine MRI require, for example, the acquisition of a series of low-resolution navigator images, such as in the method described by A. C. Larson, et al., in "Preliminary Investigation of Respiratory Self-Gating for Free-Breathing Segmented Cine MRI," *Magnetic Resonance in Medicine*, 2005; 53(1):159-168. In such navigator-based methods, the navigator echoes are commonly placed before and/or after the imaging shot with a time gap of around 30-40 ms. Any motion that occurs during this time gap is not accounted for in the motion compensation. This is not problematic in MOCCA-based self-gating since the MOCCA echoes can be placed anywhere during the imaging sequence, thereby eliminating the time gap.

In coronary artery MRI, the motion of the coronary arteries is commonly assumed to be 60 percent of the superior-inferior motion of the right hemidiaphragm, which is where navigator echoes are commonly placed for navigator-based respiratory gating. However, this relationship has been shown to be dependent on the particular subject and, therefore, not always reliable. Although the majority of the respiratory motion is in the superior-inferior direction, respiratory motion also occurs in the left-right and anterior-posterior directions. Notably, respiratory motion in the left-right and anterior-posterior directions is not detectable using single projections in the superior-inferior direction.

In other methods, such as the one described by S. Uribe, et al., in "Whole-Heart Cine MRI Using Real-Time Respiratory Self-Gating," *Magnetic Resonance in Medicine*, 2007; 57(3): 606-613, a respiratory self-gated whole-heart cine MRI method using a conventional projection-based approach is employed, in which the imaging slab is required to be prescribed in the sagittal orientation to enable acquisition of a projection signal in the superior-inferior direction. In contrast to these methods, respiratory self-gating using MOCCA does not require the acquisition of a series of low-resolution navigator images. In addition, the MOCCA echo may be acquired in any arbitrary double-oblique direction. This lack of restricted acquisition direction enables 2D cine MRI in the standard short axis or long axis views.

Recently, a self-gated coronary artery MRI technique using six projections before each imaging shot in order to account for motion in three directions has been provided, such as the method described by Lai, et al., in "A Respiratory Self-Gating Technique with 3D-Translation Compensation for Free-Breathing Whole-Heart Coronary MRA," *Magnetic Resonance in Medicine*, 2009; 62(3):731-738. Such a method, while advantageous in that motion in three directions can be monitored, significantly lengthens scan time, especially for patients with high heart rates. To the contrary, MOCCA is advantageous in that it only requires one additional data line to derive the respiratory self-gating signal in the presence of 3D respiratory motion.

Figure 6:
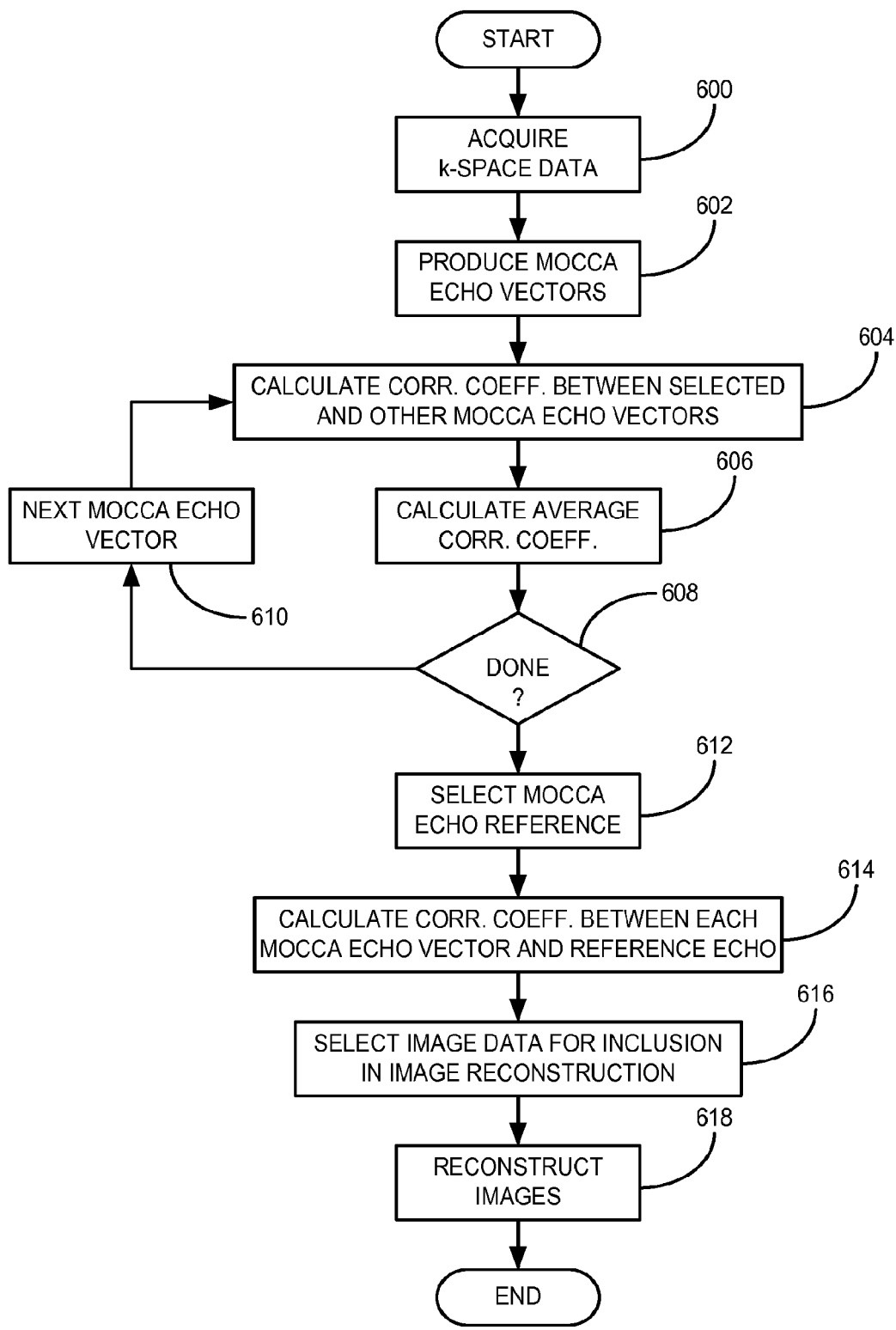
FIG. 6 is a flowchart setting forth the steps of an exemplary method for respiratory self-gating using a MOCCA method.

Referring now particularly to FIG. 6, a flowchart setting forth the steps of an exemplary method for respiratory self-gating using MOCCA is illustrated. First, image data is acquired, as indicated at step 600. For example, image data may be acquired using a SSFP-type pulse sequence. In general, a MOCCA echo is acquired before each repetition of the pulse sequence employed and a time series of image frames are acquired while the subject is allowed to breathe freely. When imaging the heart, a retrospectively ECG-gated SSFP sequence may be employed to perform free-breathing cardiac cine imaging in the standard short-axis, two-chamber, and four-chamber orientations. In such a situation, a MOCCA echo is acquired before each SSFP segment for every cardiac phase. In this manner, the acquired image data includes image data for a plurality of cardiac phases over at least one cardiac cycle. Moreover, the portion of acquired image data corresponding to each cardiac phase, referred to as a "cardiac phase image data set," also includes a plurality of MOCCA echoes.

Next, a MOCCA echo vector is produced for each image frame from the acquired image data, as indicated at step 602. As described above, each MOCCA echo vector is produced from the acquired k-space data corresponding to the related image frame. For example, the magnitude of the center line of each k-space data set is stacked into a column vector in accordance with Eqn. (4).

A correlation coefficient is then calculated between a selected MOCCA echo vector and each of the other MOCCA echo vectors, as indicated at step 604. In this manner, a plurality of correlation coefficients are calculated for each MOCCA vector and, therefore, for each respective image of the subject. For each image of the subject, an average correlation coefficient is calculated by averaging all of the calculated correlation coefficients related to that image, as indicated at step 606. A determination is then made at decision block 608 as to whether each MOCCA echo vector has been processed in the preceding manner. If not, a next MOCCA echo vector is selected at step 610, and steps 604 and 606 are repeated in order to produce an average correlation coefficient corresponding to the selected MOCCA echo vector.

Once an average correlation coefficient has been calculated for each MOCCA echo vector, this information is utilized to select one of the MOCCA echo vectors as a MOCCA echo reference, as indicated at step 612. The MOCCA echo corresponding to the largest average correlation coefficient is selected as the MOCCA echo reference. Effectively, the selected MOCCA echo reference corresponds to an echo that was acquired at the end-expiration respiratory phase. It is noted that in cardiac imaging applications, a separate MOCCA echo reference is selected for each cardiac phase.

Following the selection of the MOCCA echo reference, a correlation coefficient is calculated between echo MOCCA echo vector and the selected MOCCA echo reference, as indicated at step 614. Using the calculated correlation coefficients, a subset of the acquired image data is selected for reconstruction, as indicated at step 616. For each imaging segment, the image data acquired following the MOCCA echo vector corresponding to the highest correlation coefficient is selected. From the selected subset of image data, an image of the subject is reconstructed, as indicated at step 618. In this manner, the selected subset of image data is indicative of a respiratory self-gated image acquisition. Again, for self-gating in cine MRI, this process is repeated for each cardiac phase.

Thus, a method for motion estimation and compensation using coil arrays, in which navigators are not required and in which coil-dependent motion-related signal variations are employed to determine information related to motion in two and three directions, has been provided. Such a method does not require the acquisition of additional image data to estimate and compensate for complex motions in more than one direction. This method is applicable not only to rigid motion compensation, but also to self-gating methods utilized to reduce cardiac and respiratory motion.

Compared with previous projection-based motion estimation methods, MOCCA has several advantages. It is capable of resolving two- and three-dimensional motion based on a one-dimensional MOCCA echo in any arbitrary direction, because a localized coil map provides the additional information needed to resolve the multi-dimensional motion. This is in contrast to conventional methods where motion in certain direction needs to be resolved by a projection in the same direction.

Compared with existing breath-held cine MRI methods, MOCCA self-gating provides clinically useful imaging acquisitions without the necessity for the patient to hold their breath during the acquisition, which may be problematic for certain patients. Cardiac self-gating methods with MOCCA also provide clinically useful images without the need for ECG signal hook-ups, and improve arrhythmia rejection because they provide a direct account of the cardiac motion.

The present invention has been described in terms of one or more preferred embodiments, and it should be appreciated that many equivalents, alternatives, variations, and modifications, aside from those expressly stated, are possible and within the scope of the invention. For example, MOCCA rotation estimation may be integrated with existing rotation correction using Cartesian sampling. In such an application, MOCCA is capable of rotation correction using a single one-dimensional k-space center line that is acquired in the frequency-encoding direction. It is also possible to integrate MOCCA into spiral and radial sampling trajectories, which are intrinsically compatible with rotation correction. In addition, the PROPELLER method may benefit from MOCCA by using signal from multiple coils separately instead of combining all the coil signals before applying the algorithm.

The invention claimed is:

1. A method for self-gating an imaging study with a magnetic resonance imaging (MRI) system, the steps comprising:
  a) acquiring, with the MRI system, a k-space data set from each radio frequency (RF) receiver coil in a coil array, each acquired k-space data set including signal variations indicative of motion of a portion of a subject that occurs relative to the respective receiver coil;
  b) selecting a portion of the k-space data sets acquired in step a) as reference data;
  c) comparing the acquired k-space data sets with the selected reference data in order to produce a gating signal indicative of the motion of the portion of the subject that occurred relative to the coil array; and
  d) utilizing the produced gating signal to reconstruct an image of the subject from the acquired k-space data sets in which motion of the portion of the subject is substantially suppressed.

2. The method as recited in claim 1 in which the portion of the subject is a heart, the motion of the portion of the subject is cardiac motion, and step a) is repeated a plurality of times so that a plurality of cardiac phase k-space data sets are acquired from each RF receiver coil in the coil array.

3. The method as recited in claim 2 in which step b) includes:
  b)i) producing a plurality of coil echo signal vectors from the associated acquired cardiac phase k-space data sets, each coil echo signal vector being produced for a given cardiac phase; and
  b)ii) selecting the coil echo signal vector associated with the cardiac phase k-space data set last acquired as the reference data.

4. The method as recited in claim 3 in which step c) includes:
  c)i) calculating a plurality of correlation coefficients, each correlation coefficient being calculated between a selected one of the plurality of coil echo signal vectors and the reference data; and
  c)ii) producing the gating signal using the calculated plurality of correlation coefficients.

5. The method as recited in claim 2 in which step d) includes identifying a plurality of trigger points in the produced gating signal by performing peak detection on the gating signal, the trigger points corresponding to time points at which associated k-space data sets were acquired during step a).

6. The method as recited in claim 5 in which step d) further includes reconstructing images from the k-space data sets associated with the plurality of trigger points identified in the gating signal.

7. The method as recited in claim 1 in which the portion of the subject is at least one of a lung and a diaphragm and the motion of the portion of the subject is respiratory motion.

8. The method as recited in claim 7 in which step b) includes:
  b)i) producing a plurality of coil echo signal vectors from the acquired k-space data sets;
  b)ii) calculating a plurality of correlation coefficients, each correlation coefficient being calculated between a selected one of the plurality of coil echo signal vectors and another one of the plurality of coil echo signal vectors;
  b)iii) calculating an average correlation coefficient using the calculated plurality of correlation coefficients; and
  b)iv) selecting the coil echo signal vector associated with the substantially maximum average correlation coefficient as the reference data.

9. The method as recited in claim 8 in which step c) includes:
  c)i) producing a plurality of coil echo signal vectors from the acquired k-space data sets;
  c)ii) calculating a correlation coefficient between each of the plurality of coil echo signal vectors and the reference data; and
  c)iii) producing the gating signal using the calculated plurality of correlation coefficients, the gating signal being indicative of k-space data sets acquired in step a) that are substantially correlated with the reference data.

10. The method as recited in claim 9 in which step d) includes reconstructing images from the k-space data sets acquired in step a) that are identified in the produced gating signal.

* * * * *